United States Patent [19]

Belisle

[11] Patent Number: 4,776,428

[45] Date of Patent: Oct. 11, 1988

[54] SOUND PROJECTION SYSTEM

[75] Inventor: Bruno Belisle, St. Hubert, Canada

[73] Assignee: Belisle Acoustique Inc., Chateauguay, Canada

[21] Appl. No.: 120,645

[22] Filed: Nov. 16, 1987

[51] Int. Cl.[4] .......................... G10K 11/10; H05K 5/00

[52] U.S. Cl. .................................... 181/185; 181/152; 181/159; 181/173; 181/188; 181/189; 381/156; 381/204

[58] Field of Search ............... 181/148, 152, 155, 159, 181/185–189, 191, 192, 195, 173; 381/156, 157, 204

[56] References Cited

U.S. PATENT DOCUMENTS

| | | | |
|---|---|---|---|
| 2,135,610 | 11/1938 | Wente | 181/187 |
| 2,643,728 | 6/1953 | Anthony | 181/151 |
| 3,136,382 | 6/1964 | Thalen | 181/159 X |
| 3,590,169 | 6/1971 | Merhaut | 381/156 |
| 3,866,710 | 2/1975 | Cesati | 181/159 |
| 4,181,193 | 1/1980 | Isaac | 181/185 |

*Primary Examiner*—B. R. Fuller
*Attorney, Agent, or Firm*—Robic, Robic & Associates

[57] ABSTRACT

A sound projection system for use in diffusing sound of a frequency ranging from 160 Hz up to 5 KHz over a relatively long distance with a substantially constant distribution of the sound over a wide diffusion angle, whereby the quality and intensity of the sound transmitted by the system remain substantially constant for a listener even if this person is substantially offset from the general direction and orientation of the projection system. The system which is advantageously compact in size, comprises a cabinet defining an enclosure in which a loudspeaker is mounted. An acoustic channel of rectangular cross-section is connected to the cabinet in alignment with the loudspeaker. The channel which tapers laterally outwardly from its front end towards its rear end, comprises at least three profile shaped partitions extending vertically therein, the partitions being spaced apart in such a manner as to divide at least one substantial portion of the channel into a plurality of sub-channels substantially equal in size and shape. At least one of the partitions is centrally positioned in the channel in front of the loudspeaker. Each of the partitions has a front end projecting from the front end of the channel into the space defined by the cone-shaped diaphragm of the loudspeaker. Each of the partitions extends as close as possible to the diaphragm and is externally shaped to cause an air restriction adjacent the loudspeaker of the diaphragm and then a plurality of continuously expanding passages along the channel, through which the sound may expand.

4 Claims, 3 Drawing Sheets

SOUND PROJECTION SYSTEM

BACKGROUND OF THE INVENTION (a) Field of the invention

The present invention relates to a sound projection system for use in diffusing sound of a frequency ranging from as low as 160 Hz up to 5 KHz over a relatively long distance with a substantially constant distribution of the sound over a wide diffusion angle.

(b) Brief description of the prior art

Sound projection systems especially designed for use outdoors or in other environments where sound must be transmitted to substantial distances, are well known in the art.

All of these known systems make use of a channel or duct of gradually increasing cross-section, generally known as "horn", which is fixed to a cabinet enclosing a loudspeaker. In practice, such a channel acts as an acoustic amplifier that increases the usually small vibrating area of the loudspeaker diaphragm at the inlet (or "throat") of the channel into a much larger vibration area at the outlet (or "mouth") of this channel.

It is also well known in the art that if the inlet of the channel is of substantially the same dimension as the diaphragm, losses due to interferences occur with respect to frequencies corresponding to wave lengths at least four times bigger than the size of the inlet.

A standard method for overcoming this problem consists in providing a compression stage between the diaphragm and the inlet of the acoustic channel to increase the air density close to the diaphragm. This standard method is usually carried out by positioning a small perforated wall in front of, and very close to the diaphragm, to form a small compression chamber adjacent this diaphragm. Alternatively and preferably, the above problem is overcome by positioning a stream-lined plug in the middle of the inlet of the channel to substantially reduce its surface area [see for examples, U.S. Pat. Nos. 3,886,710 (CESATI) and 4,181,193 (ISAAC)].

In the former case, the number, the position and dimension of the perforations in the wall must be carefully determined to avoid the generation of resonances of high order in the compression chamber. In the latter case, the external shape of the plug must also be carefully determined to avoid the development of resonances due to the cross-sectional reduction of the channel due to the plug and the direction changes in the passage(s) left available in this channel.

Most of the sound projection systems presently available in the market make use of a stream-lined plug, also known as "face plug", as explained hereinabove, because such a use makes them much easier to manufacture and adjust than those using a perforated wall. The major drawback however with these face-plug equiped, sound projection systems is that they always transmit the sound in the form of a narrow beam that is often annular (see, for example, the preamble of U.S. Pat. No. 4,181,193). None of the existing systems known to the Applicant are actually capable of transmitting or diffusing sound within a wide frequency range with a substantially constant distribution over a wide diffusion angle.

OBJECT AND SUMMARY OF THE INVENTION

The object of the present invention is to provide a new sound projection system which overcomes the above mentioned drawback of the known systems.

More particularly, the object of the invention is to provide a sound projection system which is capable of diffusing sound within a wide frequency range over a relatively long distance with a substantially constant distribution over a wide diffusion angle, whereby the quality and intensity of the sound transmitted by the system remain substantially constant for a listener whether or not this person is substantially offset from the general direction and/or orientation of the acoustic channel of the system.

The sound projection system according to the invention is compact in size. This feature is rather interesting in practice as it makes the system easy to handle and store. This system structurally comprises a cabinet defining an enclosure and having an acoustically opened front wall. A loudspeaker is mounted in the enclosure of the cabinet. This loudspeaker has a magnet and coil assembly and a cone shaped diaphragm positioned across and closing the acoustically opened front wall of the cabinet. An acoustic channel of rectangular cross-section having a top wall, a bottom wall and a pair of side walls, is aligned with the loudspeaker. This channel has an acoustically opened front end connected to the cabinet and an acoustically opened rear end. In addition, this channel tapers laterally outwardly from its front end to its rear end. At least three profile-shaped partitions extend from the top wall to the bottom wall of the channel. These partitions are spaced-apart in such a manner as to divide at least one substantial portion of the length of the channel into a plurality of sub-channels substantially equal in size and shape with at least one of the partitions being centrally positioned inside the channel in front of the loudspeaker. Each of the partitions has a front end projecting from the front end of the channel into the space defined by the cone-shaped diaphragm in the front wall of the cabinet, in such a manner as to extend as close as possible to this diaphragm. Each of the partitions is also externally shaped to cause an air restriction adjacent the loudspeaker diaphragm and then a plurality of continuously extending passages in the channel, through which the sound may expand.

In accordance with a particularly preferred embodiment of the invention, the front end of the partitions are machined to define together a cone-shaped surface of substantially the same shape as the surface of the diaphragm. The partitions are also angularly orientated in the channel to point toward the center of the magnet and coil assembly of the loudspeaker. In addition, the partitions are shaped to make the passages in the channel continuously expanding in an exponential manner. This particular embodiment is rather interesting in that it eliminates almost each of the causes giving rise to the development of resonances of high order that would otherwise substantially affect a quality of the sound.

Thanks to the partitions which divide the channel into a plurality of sub-channels, a substantially constant distribution of sound is obtained over a wide diffusion angle. In practice, each passage defined by a sub-channel, forms a king of "horn" that projects sound in the form of a narrow beam. However, since the number of these narrow beams is equal to the number of partitions plus one, the distribution of the sound may be considered as substantially constant within the diffusion angle of the sound projection system, which diffusion angle is substantially identical to the angle defined by the externally outwardly tapering side walls of the channel.

BRIEF DESCRIPTIONS OF THE DRAWINGS

A standard, sound projection system presently available in the market and a preferred embodiment of a sound projection system according to the invention will now be described with reference to the accompanying drawings in which:

FIG. 1 identified as "prior art", is a cross-sectional top plan view of a standard, sound projection system presently available in the market;

DESCRIPTION OF A STANDARD, SOUND PROJECTION SYSTEM

Figure 2:
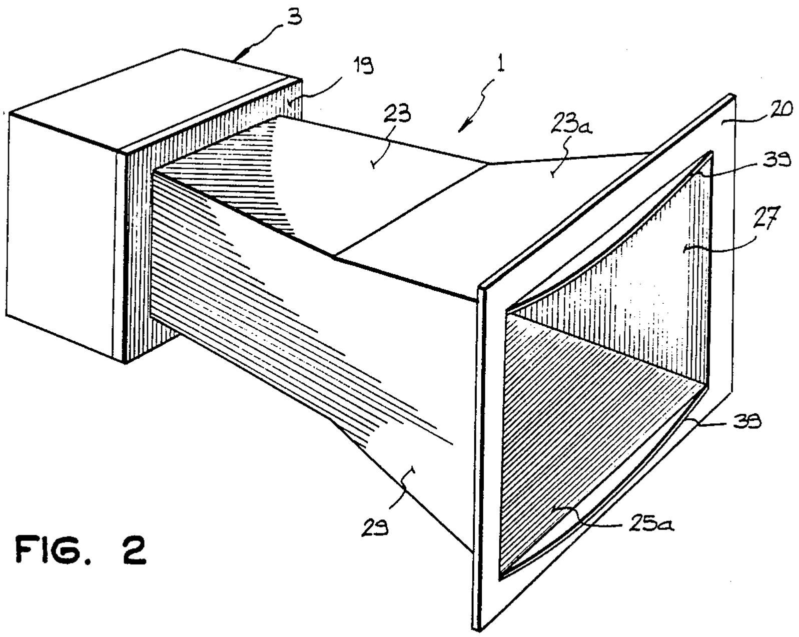
FIG. 2 is a perspective view of a sound projection system according to the invention.
Figure 1:
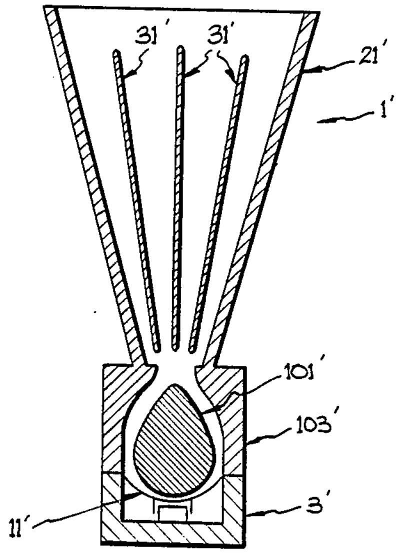
FIG. 1 (PRIOR ART)

The sound projection system 1' shown in FIG. 1 comprises a cabinet 3' defining an enclosure in which is mounted a loudspeaker 11' of conventional structure. The system 1' also comprises a channel 21' of forwardly increasing cross-section, provided with a plurality of flat partitions 31' extending vertically into the channel 21'. The partitions are spaced apart in such a manner as to divide at least one substantial portion of the length of the channel 21' into a plurality of sub-channels substantially equal in size and shape.

To avoid losses of sound in the upper frequency range, a stream-lined face plug 101' is positioned in the middle of a small chamber 103' intercalated between the inlet of the channel 21' and the cabinet 3'. This plug 101' known as "face plug", advantageously permits to avoid the above mentioned losses. It is however compulsory that this plug be stream-lined to prevent the development of resonances due to the cross-sectional reduction of the air gap between the diaphragm of the loudspeaker 11' and the inlet 21' of the channel.

Of course, the chamber 103' containing the plug 101', which chamber 103' is positioned between the cabinet 3' and the partitioned channel 21', causes a substantial increase in length of the sound projection system 1'.

DESCRIPTION OF A PREFERRED EMBODIMENT OF THE INVENTION

The sound projection system 1 according to the invention as shown in FIGS. 2 to 5 is substantially shorter in size and therefore more compact than the prior art system 1' shown in FIG. 1, in that it does not need nor include any plug-containing chamber equivalent to chamber 103' of the prior art system 1' shown in FIG. 1.

The sound projection system 1 comprises a cabinet 3 defining an enclosure 5. The cabinet 3 which can be made of wood or rigid polyurethane and may be lined with a sound damping material 6 known per se, has an opening 7 in its front wall, defining an acoustic opening.

A loudspeaker 11 is mounted in the enclosure of the cabinet 3. The loudspeaker is provided, as usual, with a magnet and coil assembly 13 and with a generally cone-shaped diaphragm 15 which is positioned across the acoustic opening 7 in the front wall on the cabinet to close the same. Such a positioning on the loudspeaker inside a closed cabinet is quite interesting in that it actually allows to lower the lower limit of the frequency range from 400 Hz down to 160 Hz.

The sound projection system 1 also comprises an acoustic channel 21' of rectangular cross-section having a top wall 23, a bottom wall 25 and a pair of side walls 27 and 29. The channel 21 which is preferably made of wood or any other rigid material such as polyurethane has an opened front end defining an acoustic opening 17, which is of substantially the same size as the opening 7. This acoustic channel 21 is directly connected to the cabinet 3 by means of a wall-surrounding flange 19. Another surrounding flange 20 may be provided all around the channel 21 at the acoustically opened rear end or outlet of the channel 21, to reinforce the same.

Figure 3:
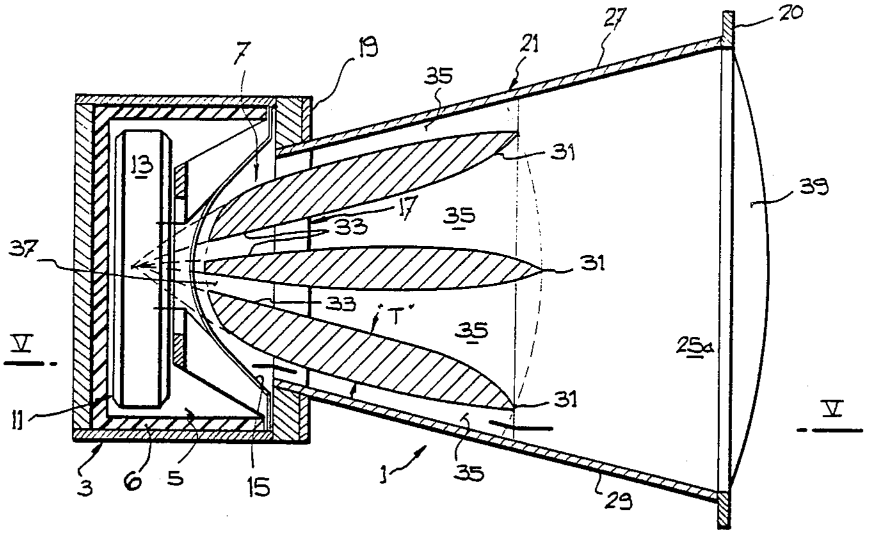
FIG. 3 is a cross-sectional, top plan view of the sound projection system shown in FIG. 2.
Figure 4:
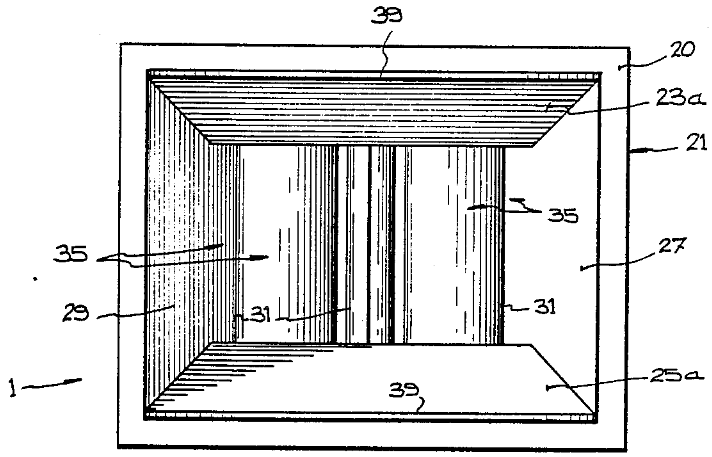
FIG. 4 is a front elevational view of the sound projection system shown in FIGS. 2 and 3.

The side walls 27 and 29 of the channel 21 are angularly positioned as clearly shownin FIG. 3 to make the channel taper laterally outwardly from its front end 17 to its rear end. Three profile-shaped partitions 31 are provided in the channel 21. The partitions 31 extend from the top wall 23 down to the bottom wall 25 of the channel and are spaced apart in such a manner as to define at least one substantially portion of the length of the channel into a plurality of sub-channels substantially equal in size and shape as clearly shown in FIG. 3.

The number of partitions is not essential. In accordance with the invention, it is however essential that at least one of the partitions 31 be centrally positioned inside the channel in front of the loudspeaker 11. It is also important although not essential, that the length of the partitions inside the channel be ajusted as a function of the size of the diaphragm 15 of the loudspeaker 11. By way of example, if use is made of a diaphragm having a 2 inches diameter, it is compulsory that the partitions 31 extend inside the channel 21 over a distance comprised between 7 and 9 inches in order to avoid losses of sound in the lower frequency range (lower than 400 Hz).

In accordance with the invention, it is also essential that each of the partitions 31 has a front end 33 projecting from the front end opening 17 of the channel 21 into the space defined by the cone-shaped diaphragm 15 mounted in the front wall of the cabinet 3. It is further essential that each of the partitions 31 extend as close as possible to the diaphragm 15 and be externally shaped to cause an air restriction adjacent the diaphragm 15 and then a plurality of continuously expanding passages 35 along the channel 21, through which the sound may expand.

The front end 33 of the partitions that are preferably made of wood or rigid polyurethane, are machined to form together a cone-shaped surface (shown in dotted line in FIG. 3) having substantially the same shape as the surface of the diaphragm 15.

The partitions 31 are also angularly oriented in the channel to point towards the center of the magnet and coil assembly 13 of the loudspeaker 11, as also shown with dotted line in FIG. 3. Moreover, the partitions 31 are advantageously shaped in a stream-lined manner to make the passages 35 in the channel 21 continuously expanding in an exponential manner and thus to avoid as much as possible the development of resonances due to the cross-sectional reduction of the channel 21 and the direction changes in the passages 35 left available in this channel.

By way of example, when use is made of a two-inch diaphragm, the front end of the partitions may be positioned at from $\frac{1}{4}$ to $\frac{3}{8}$ inch from the surface of the cone-shaped diaphragm 15.

Moreover, to allow a proper exponential increase of the passage 35, the partitions are preferably selected and shaped in such a manner as to have a maximum thickness T of about 1.5 inches.

Figure 5:
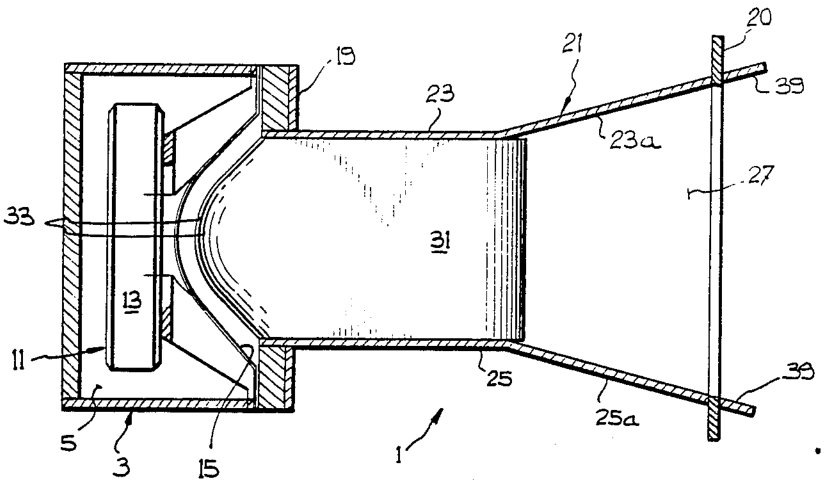
FIG. 5 is a cross-sectional, side elevational view of the sound projection system shown in FIGS. 2 to 4, taken along line V—V of FIG. 3.

As shown in FIG. 5, the top and bottom walls 23 and 25 of the channel 21 are preferably parallel over the length of the partitions 31. Then, the top wall 23 and bottom wall 25 may taper away from each other at 23a and 25a to form with the lateral walls a frusto-pyramidal outlet. If desired, a pair of horizontal "lips" 39 may be provided along the top and bottom edges of the rear end of the channel 21 to facilitate the installation of a protective grid or foam panel (not shown).

As can now be understood, the very specific position and shape of the partitions 31 inside the channel 21 and the opening 7 of the cabinet 3 provides an air restriction close to the diaphragm 15 and, downstream, an exponential air expansion which is known per se to reduce as much as possible the formation of resonances that may otherwise affect the quality of the sound. This particular position of the partitions 31 avoids the presence of an intercalated chamber 103' as shown in FIG. 1, thereby making the system compact in size, especially in length. In addition, the partitions 31 which divide the channel 21 into a plurality of "horns" 35, provide an excellent distribution of the sound over a wide horizontal diffusion angle. Because of this distribution, it becomes possible to transmit sound to a frequency as high as 5 KHz, contrary to the standard system as shown in FIG. 1 wherein, in practice, transmission is limited to sound of a frequency lower than 1.5 KHz because of the sound concentration due to the face plug.

It is worth mentioning that tests carried out by the Applicant with a loudspeaker having a two inch diaphragm has led to result as good as those usually achieved with a standard device making use of 4 inches diaphragm (that are must more expensive). Moreover, the quality of the sound that was so obtained was better, probably because of the very specific shape of the channel which is square or rectangular in cross-section, and is positioned downstream the diaphragm and opening 7 of the cabinet which are both round.

I claim:

1. A sound projection system for use in diffusing sound of a frequency ranging from 160 Hz up to 5 KHz over a relatively long distance with a substantially constant distributing of said sound over a wide diffusion angle, said system being compact in size and comprising:

a cabinet defining an enclosure and having an acoustically opened front wall;

a loudspeaker mounted in the enclosure of the cabinet, a loudspeaker having a magnet and coil assembly and a cone-shaped diaphragm positioned across, and closing, said acoustically opened front wall, said cone-shaped diaphragm defining a space in said front wall;

an acoustic channel of rectangular cross-section having a top wall, a bottom wall and a pair of side walls, said channel being aligned with the loudspeaker and having an acoustically opened front end connected to the cabinet and an acoustically opened rear end, said channel tapering laterally outwardly from said front end to said rear end; and at least three profile shaped partitions extending from the top wall to the bottom wall of the channel, said partitions being spaced apart in such a manner as to divide at least one substantial portion of the channel into a plurality of sub-channels substantially equal in size and shape with at least one of said partitions centrally positioned inside the channel in front of the loudspeaker, each of said partitions having a front end projecting from the front end of the channel into the space defined by the cone-shaped diaphragm in the front wall of the cabinet, each of said partitions extending as close as possible to said diaphragm and being externally shaped to cause an air restriction adjacent the diaphragm and then a plurality of continuously expanding passages through which the sound may expand.

2. The sound projection system of claim 1, wherein:

the front ends of the partitions are machined to define together a cone-shaped surface of substantially the same shape as the surface of the diaphragm;

the partitions are angularly oriented in the channel to point toward the center of the magnet and coil assembly of the loudspeaker; and the partitions are shaped to make the passages in the channel continuously expanding in an exponential manner.

3. The sound projection system of claim 2, wherein:

the cone-shaped diaphragm of the loudspeaker has a 2 inches diameter;

the acoustic channel contains only three partitions extending inside the channel over a distance of about 7 to 9 inches;

the top and bottom walls of the channel are parallel over the length of the partition and then taper away from each other to form with the lateral walls a frustopyramidal outlet;

the partitions have a maximum in thickness of about 1.5 inches; and the front ends of the partitions are positioned at from $\frac{1}{4}$ to $\frac{3}{8}$ inch from the surface of the cone-shaped diaphragm.

4. The sound projection system of claim 3, wherein:

the cabinet and acoustic channel are made of a material selected from the group consisting of wood and rigid polyurethane;

the cabinet contains a sound damping material surrounding the loudspeaker in the enclosure; and the partitions are made from machined pieces of a material selected from the group consisting of wood and rigid polyurethane.

* * * * *